United States Patent [19]

Date et al.

[11] Patent Number: 6,018,210

[45] Date of Patent: Jan. 25, 2000

[54] METHODS FOR CONTROLLING THE ELASTIC MODULUS OF PIEZOELECTRIC SUBSTANCES AND APPARATUS THEREFOR

[75] Inventors: Munehiro Date, 12-24, 2-chome, Shiroganedai, Minato-ku, Tokyo; Masayuki Kutani, Wako; Shigeru Sakai, Asashigaoka Jyutaku 906, 10-13, 4-chome, Asashigaoka, Asaka-shi, Saitama, all of Japan

[73] Assignees: The Institute of Physical and Chemical Research (Riken); Munehiro Date, Tokyo; Shigeru Sakai, both of Japan

[21] Appl. No.: 08/920,902

[22] Filed: Aug. 29, 1997

[30] Foreign Application Priority Data

Aug. 30, 1996 [JP] Japan .................................. 8-230491

[51] Int. Cl.[7] .................................................... H01L 41/08
[52] U.S. Cl. ........................ 310/311; 310/316; 310/317; 310/319; 310/326; 318/116
[58] Field of Search .................................. 310/316, 317, 310/318, 312, 326, 327, 328, 366, 311, 321; 318/116–118

[56] References Cited

U.S. PATENT DOCUMENTS

| | | | |
|---|---|---|---|
| 3,047,823 | 7/1962 | Ranky | 310/318 X |
| 3,843,897 | 10/1974 | Mishiro | 310/316 |
| 4,093,885 | 6/1978 | Brown | 310/316 X |
| 4,451,710 | 5/1984 | Taylor et al. | 310/316 X |
| 4,453,141 | 6/1984 | Rosati | 331/158 |
| 4,565,940 | 1/1986 | Hubbard, Jr. | 310/326 |
| 4,709,360 | 11/1987 | Martin et al. | 310/316 X |
| 4,980,597 | 12/1990 | Iwao | 310/316 X |
| 5,144,208 | 9/1992 | Schiessle et al. | 318/118 |
| 5,153,476 | 10/1992 | Kosinski | 310/316 X |
| 5,558,477 | 9/1996 | Browning et al. | 310/316 X |
| 5,581,142 | 12/1996 | Terajima | 310/316 |
| 5,783,898 | 7/1998 | Wu | 310/316 |

*Primary Examiner*—Mark O. Budd
*Attorney, Agent, or Firm*—Griffin, Butler, Whisenhunt & Szipl, LLP

[57] ABSTRACT

The elastic modulus of a piezoelectric substance is controlled over a wide range using a simple method. The effective modulus (the real part of the elastic modulus) and the energy loss modulus (the imaginary part of the elastic modulus) of the piezoelectric substance are changed by installing electrodes on the surface of the piezoelectric substance and by connecting a mechanism consisting of one or more circuit elements to each of the electrodes.

21 Claims, 9 Drawing Sheets

METHODS FOR CONTROLLING THE ELASTIC MODULUS OF PIEZOELECTRIC SUBSTANCES AND APPARATUS THEREFOR

BACKGROUND OF THE INVENTION

1. Field of Invention

The present invention relates to a method for controlling the elastic modulus of piezoelectric substances with which the elastic modulus of piezoelectric substances can be changed to a great degree based on a simple method. The present invention also relates to a piezoelectric device having a controllable effective elastic modulus.

2. Description of Related Art

In general, a piezoelectric substance generates an electromotive force when an external mechanical force is applied to it. Such an effect is called the combined mechanical-electrical effect. The generated electromotive force is combined with the applied external force which originally causes a deformation, and causes a further deformation of the substance. This effect is called the combined electrical-mechanical effect.

In this case, the generated electromotive force which causes the additional deformation counteracts the applied mechanical force. As a result, the piezoelectric substance appears to be hardened. The electromotive force generated can be measured in the form of a voltage by installing electrodes on the piezoelectricity generating surface of the piezoelectric substance.

The magnitude of the electrical-mechanical reaction, which represents the apparent rigidity of the piezoelectric substance, changes as the electrodes are shorted and opened.

However, the elastic modulus of the piezoelectric substance changes by at most a few percent by simply shorting and/or opening the electrodes installed on the piezoelectricity generating surface of the piezoelectric substance. This is due to the fact that the magnitude of this effect is proportional to the square of the electrical-mechanical coupling coefficient k, and that the value of k is at most about 0.2 in the case of an ordinary piezoelectric substance.

Hence, the amount of change in the elastic modulus of the piezoelectric substance achievable by the conventional method is at most a few percent, and does not exceed the margin of error in the measurement of the elastic modulus of the piezoelectric substance. So far, there has been no way to change the elastic modulus of a piezoelectric substance to any great extent even though it has been known that a piezoelectric substance with large achievable amount of change in the elastic modulus provides a device applicable to various fields.

SUMMARY OF THE INVENTION

It is an object of the present invention to provide a method for controlling the elastic modulus of piezoelectric substances by which the elastic modulus of a piezoelectric substance can be easily changed over a wide range.

In order to achieve the above-mentioned object, according to the first embodiment of the present invention, electrodes are installed or disposed on the surface of a piezoelectric substance, and a mechanism consisting of one or more circuit elements is attached to each of the electrodes. The elastic modulus of the piezoelectric substance is controlled so as to change the effective elastic modulus (the real part of the complex valued elastic modulus) and the energy loss modulus (the imaginary part of the complex valued elastic modulus) of the piezoelectric substance over a wide range.

The first embodiment of the present invention provides a method for controlling the effective elastic modulus of a piezoelectric substance, comprising the steps of (1) disposing electrodes on the piezoelectric substance; (2) connecting a circuit element to the electrodes; and (3) controlling the effective elastic modulus and the energy loss modulus of the piezoelectric substance with the circuit element. The electrical characteristics of the circuit element can be changed to further control the effective elastic modulus and the energy loss modulus of the piezoelectric substance. The circuit element is preferably selected from the group consisting of a resistor element, a capacitance element, a negative resistor element, and a negative capacitance element.

According to a second embodiment of the present invention, electrodes are installed or disposed on the surface of a piezoelectric substance. In addition, a distortion sensor which transforms a distortion of the piezoelectric substance into an electric signal or a stress sensor which transforms a stress applied to the piezoelectric substance into an electric signal is installed. Another method for controlling the elastic modulus of a piezoelectric substance with which the effective elastic modulus (the real part of the complex valued elastic modulus) and the energy loss modulus (the imaginary part of the complex valued elastic modulus) of the piezoelectric substance can be changed is provided by impressing the electric signal emitted from one of the above-mentioned two sensors to the electrodes.

The second embodiment of the present invention thus provides a method according to the invention comprises the steps of (1) disposing electrodes on the piezoelectric substance; providing a distortion sensor which transforms a distortion of the piezoelectric substance into an electric signal; and controlling the effective elastic modulus and the energy loss modulus of the piezoelectric substance by supplying the electric signal of the distortion sensor to the electrodes. This second embodiment preferably also comprises the step of changing at least one of the phase and the amplitude of the electric signal before supplying the signal to the electrodes.

In a variation of the second embodiment, the method comprises the steps of (1) disposing electrodes on the piezoelectric substance; (2) providing a stress sensor which transforms a stress applied to the piezoelectric substance into an electric signal; and controlling the effective elastic modulus and the energy loss modulus of the piezoelectric substance by supplying the electric signal of the stress sensor to the electrodes. The stress sensor can be provided instead of or in addition to the distortion sensor.

The present invention also provides a piezoelectric device having a controllable effective elastic modulus. In one embodiment, the device comprises a piezoelectric substance; a pair of electrodes disposed on the piezoelectric substance; and a circuit element connected to the electrodes for controlling the effective elastic modulus and the energy loss modulus of the piezoelectric substance. The circuit element is preferably selected from the group consisting of a resistor element, a capacitance element, a negative resistor element, and a negative capacitance element.

In a further embodiment, the device comprises a piezoelectric substance; a pair of electrodes disposed on the piezoelectric substance; and a distortion sensor for transforming a distortion of the piezoelectric substance into an electric signal; and a control mechanism for feeding the electrical signal to the electrodes to control the effective elastic modulus and the energy loss modulus of the piezoelectric substance. The piezoelectric device preferable further comprises one or both of (1) a phase shifting device for shifting the phase of the electric signal supplied to the electrodes, and (2) an amplification device for changing the amplitude of the electric signal supplied to the electrodes.

A further embodiment of the piezoelectric device comprises a piezoelectric substance; a pair of electrodes disposed on the piezoelectric substance; a stress sensor for transforming a stress applied to the piezoelectric substance into an electrical signal; and a control mechanism for feeding the electrical signal to the electrodes to control the effective elastic modulus and the energy loss modulus of the piezoelectric substance. The stress sensor can be provided instead of or in addition to the distortion sensor.

BRIEF DESCRIPTION OF THE DRAWINGS

FIG. 1 (b) illustrates the characteristic curve of the permittivity of a piezoelectric substance.

FIG. 2 (b) illustrates the characteristic curve of the elastic modulus of the piezoelectric substance achieved in the first embodiment.

DETAILED DESCRIPTION OF THE PREFERRED EMBODIMENTS

The preferred embodiments of the present invention will now be explained with reference to the attached drawings. The first embodiment of the present invention will be explained in the following.

Figure 1A:
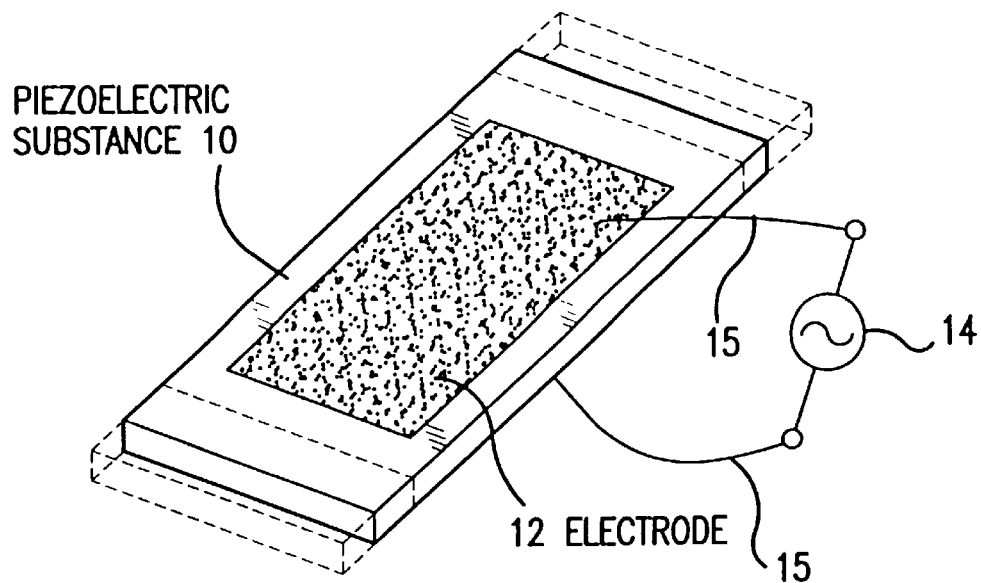
FIG. 1 (a) illustrates the structure of a conventional electric elasticity resonator.
Figure 1B:
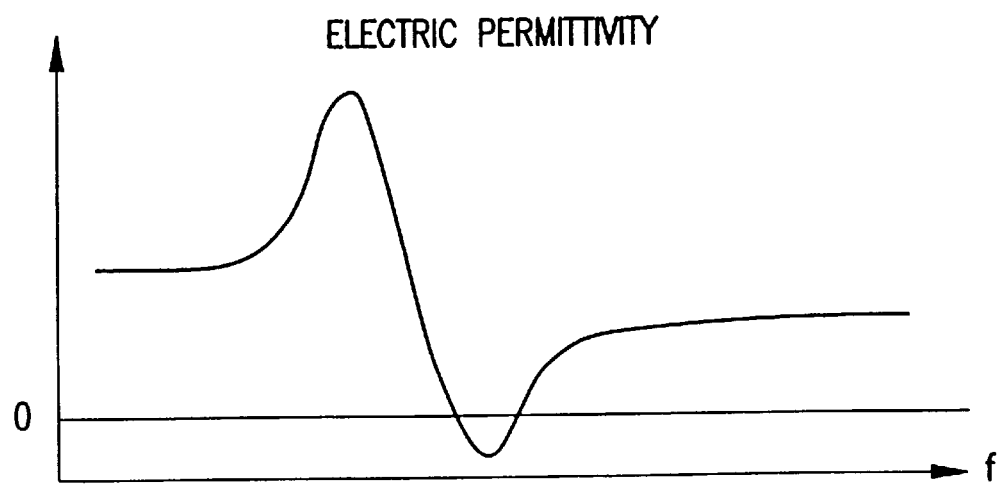

FIG. 1 (b) illustrates a dielectric piezoelectric resonance dispersion corresponding to the elastic resonance of a piezoelectric substance which is usually observed by the conventional method. The object observed comprises a piezoelectric substance 10, electrodes 12 installed or disposed on the surface of the piezoelectric substance 10, and wires 15 connected to the electrodes 12. In this manner, the object impresses a voltage supplied from an alternating current power source 14 to the wires 15, and a dielectric piezoelectric resonance dispersion is observed. The broken lines shown in FIG. 1 (a) schematically illustrate the shape of the piezoelectric substance 10 when it is deformed due to the impressed voltage.

Conductive materials such as aluminum and gold are used for the electrodes 12. The piezoelectric substance are ceramic piezoelectric materials such as P2T, complexes made of ceramic powder and rubber, complexes made of ceramic powder and plastic, ferroelectric polymers such as polyvinylidine fluoride and vinylidine fluoride-trifluoroethylene copolymer, amino acids such as polymethyl glutamate, polylactic acid and polybenzyl glutamate, cellulose and dielectric substances derived from cellulose, wood, and natural polymers such as collagen.

In FIG. 1 (b), the horizontal axis represents the frequency of the alternating voltage, and the vertical axis represents the electric permittivity of the piezoelectric substance 10. As FIG. 1 (b) illustrates, a dielectric piezoelectric resonance dispersion is observed, in which the permittivity (1) initially increases until it reaches the maximum as the frequency of the alternating voltage is increased, (2) decreases until it reaches the negative minimum after reaching the maximum, and (3) increases again and assumes positive values.

Figure 2A:
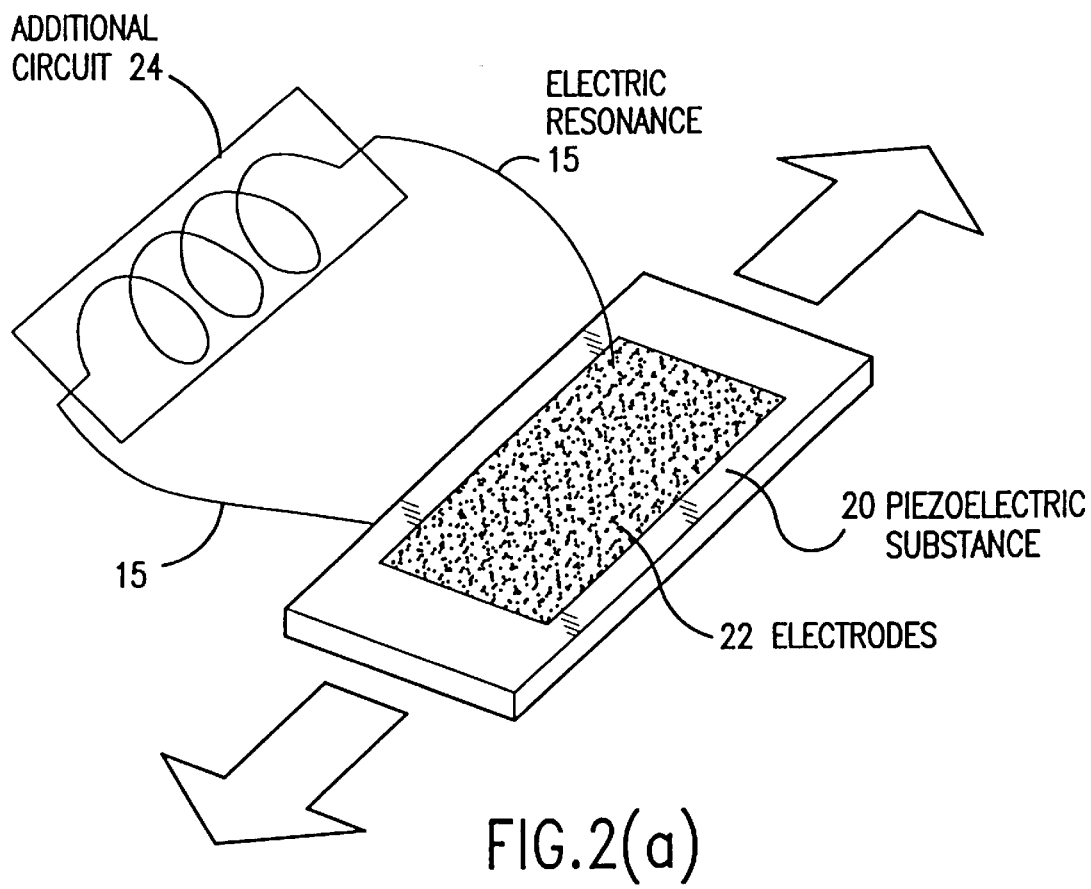
FIG. 2 (a) illustrates how the electric resonance is measured in the first embodiment of the present invention.
Figure 2B:
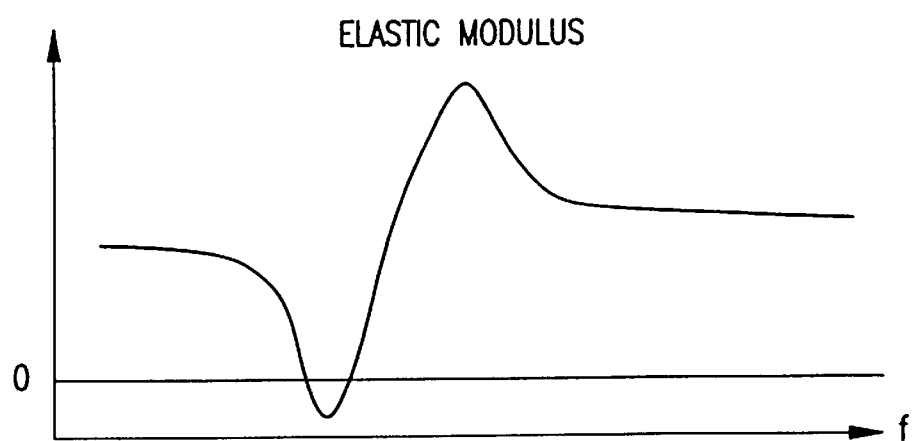

FIG. 2 (a) relates to the first embodiment of the present invention, and illustrates the electrical resonance measuring device. The electrical resonance measuring device comprises a piezoelectric substance 20, electrodes 22 installed or disposed on the surface of the piezoelectric substance 20, and an additional circuit 24 connected to electrodes 22 via wires 15. For the electrodes 22, a conductive material such as gold and aluminum can be used. For the piezoelectric substance 20, the above-mentioned materials can be used. FIG. 2 (a) illustrates an inductance element to be used for the addition circuit 24 (a mechanism consisting of one or more circuit elements).

In FIG. 2 (b), the horizontal axis represents the frequency of the mechanical vibration, and the vertical axis represents the magnitude of the elastic modulus of the piezoelectric substance 20. In FIG. 2 (b), the directions in which the mechanical vibration is applied, namely, the directions in which the elastic modulus of the piezoelectric substance 20 is measured are the directions indicated by the arrows, i.e., the longitudinal directions of the piezoelectric substance 20.

As FIG. 2 (b) shows, an elastic piezoelectric resonance dispersion is observed, in which the effective elastic modulus of the piezoelectric substance 20 (1) initially decreases until it reaches the negative minimum as the frequency of the alternating voltage is increased, (2) increases until it reaches the maximum after reaching the minimum, and (3) decreases again and remains positive-valued. Alternatives to the additional circuit 24 of FIG. 2 (a) is a single circuit element such as a resistor element, a capacitance element, a negative resistor element, and a negative capacitance element, or a circuit consisting of several connected circuit elements can be employed. In addition, a circuit having an inductance function, a resistance function, and a capacitance function or the like can be employed for the additional circuit 24. The actual structure of a circuit having the functions such as inductance and negative capacitance will be explained below.

Figure 3:
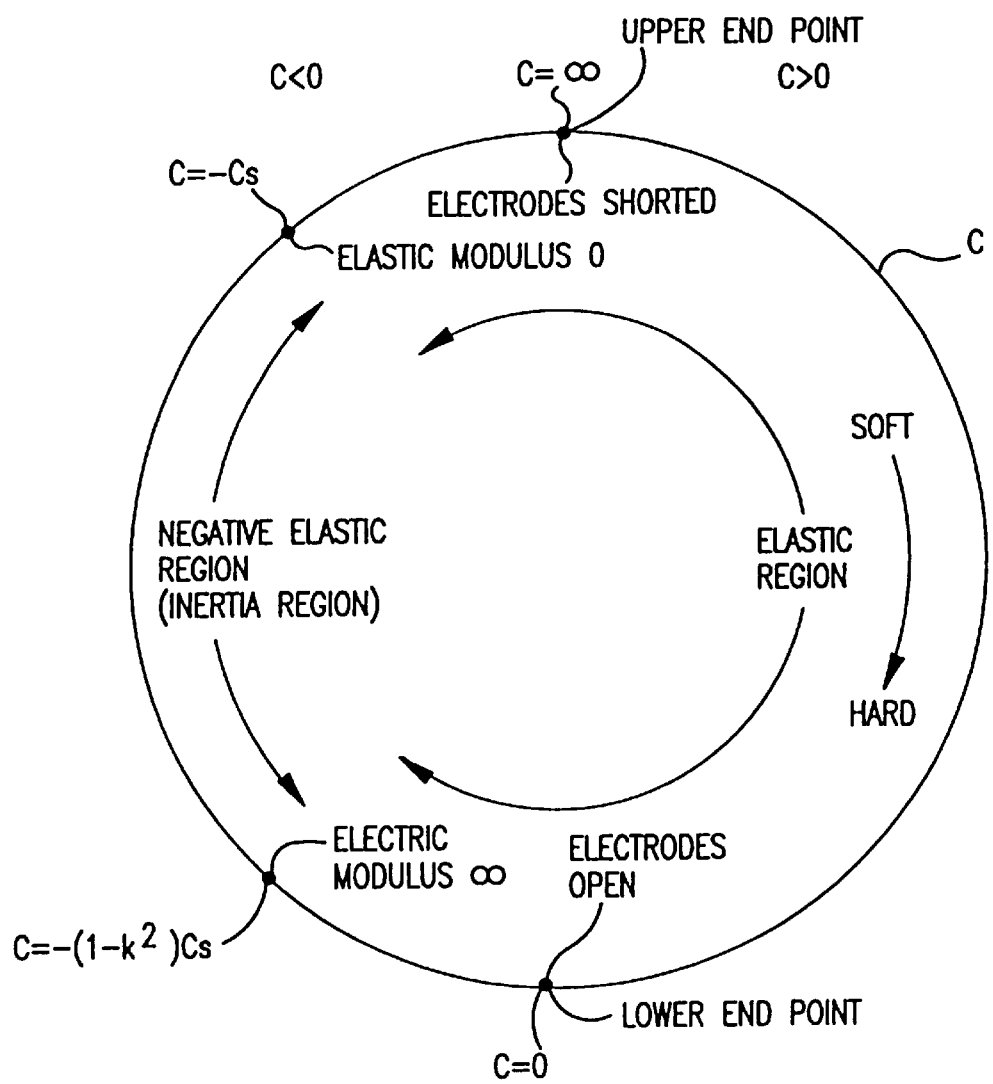
FIG. 3 illustrates a fundamental principle of the present invention.

With reference to FIG. 3, the reason for which the elastic modulus of the piezoelectric substance 20 changes in this manner when an addition circuit without being limited to any particular theory, is believed to be as follows. The case in which an addition circuit with variable capacitance C is employed will be used as an example. In FIG. 3, the circle denoted by the symbol C represents the magnitude of the variable capacitance C. The magnitude of the variable capacitance C changes corresponding to the point on the circle. The upper end point of the circle corresponds to "C=∞", namely, "the electrodes shorted". The value of C decreases but remains positive (C>0) as the point traverses the circle in the clockwise direction. The lower end point on the circle corresponds to "C=0", i.e., "electrodes open".

The value of C remains negative on the left half of the circle, and the magnitude of C increases until the point reaches the upper end point of the circle as the point traverses along the left half of the circle in the clockwise direction. The elastic modulus of the piezoelectric substance 20 changes from so-called "a soft state" to a so-called "hard state" in the elastic region as the point moves from the state "C=∞" (the upper end point) to the state "C=0" (the lower end point), i.e., the elastic modulus of the piezoelectric substance 20 changes. If the capacitance of the piezoelectric substance 20 is denoted by Cs, the elastic modulus of the piezoelectric substance 20 becomes infinity when C=−(1−k²)·Cs, which lies in the negative elastic region (inertia region). The elastic modulus of the piezoelectric substance 20 becomes 0 when C=−Cs.

As the point moves beyond the point "C=−Cs" in the clockwise direction, the elastic modulus of the piezoelectric substance 20 re-enters the elastic region. The elastic modulus of the piezoelectric substance 20 changes greatly as the value C of the capacitance of the additional circuit is changed in this manner. Moreover, the elastic modulus of the piezoelectric substance 20 can be made negative as the value C of the capacitance of the additional circuit is changed in this manner. The method with which the elastic modulus of the piezoelectric substance 20 can be changed by adding an additional circuit with variable capacity C has been explained above. Moreover, the elastic modulus of the piezoelectric substance 20 can be changed similarly by employing a circuit comprising various combined elements such as an inductance element and a resistance element or the like. The elastic modulus of the piezoelectric substance 20 can also be changed similarly by employing a circuit having an inductance function, a resistance function, and a capacitance function, or the like, as the additional circuit.

In other words, the present invention provides a method for controlling the elastic modulus of a piezoelectric substance with which the effective elastic modulus (the real part of the complex valued elastic modulus) and the energy loss modulus (the imaginary part of the complex valued elastic modulus) of the piezoelectric substance 20 can be changed by installing or disposing electrodes on the surface of the piezoelectric substance 20 and by connecting a control means or mechanism consisting of one or more circuit elements.

Here, the process in which the elastic modulus of the piezoelectric substance 20 changes due to the shunt impedance between the electrodes will be investigated theoretically although as is explained above the present invention is not limited to any particular theory of operation. First, the fundamental piezoelectric equations are represented by the following equations (1) and (2).

$$S = s^E T + dE \quad (1)$$

$$D = dT + \epsilon^T E \quad (2)$$

where S represents the strain, $S^E$ represents the elastic compliance (the reciprocal of the effective elastic modulus) when the electric field is constant, T represents the stress, d represents the piezoelectric d-constant, E represents the electric field, D represents the electric displacement, and $\epsilon^T$ represents the permittivity when the stress is constant. The electrical-mechanical coupling coefficient k is represented by the following equation (3).

$$k^2 = d^2/(s^E \epsilon^T) \quad (3)$$

If the value of the susceptance of the external element which shunts the electrodes normalized by the permittivity of the piezoelectric substance 20 is represented by α, another condition $$D/E = -\alpha \epsilon^T \quad (4)$$

is further attached. Here, shorting the electrodes corresponds to "α=ϵ", and opening the electrodes corresponds to "α=0". The following equation (5) can be obtained by eliminating D and E from equations (1) and (2) using equation (4), and by simplifying the resulting equations using equation (3).

$$S/T = s^E (1-k^2/(1+\alpha)) \quad (5)$$

If the elastic compliance of the piezoelectric substance 20 when the external element having a value α shunts the electrodes is denoted by s(α), s(α) can be represented by the following equation (6).

$$s(\alpha) = S/T = s^E (1-k^2/(1+\alpha)) \quad (6)$$

The following equations (7) through (10) can be derived from equation (6).

$$s(0) = s^E (1-k^2) \quad (7)$$

$$s(\epsilon) = s^E \quad (8)$$

$$1/s(-1) = 0 \quad (9)$$

$$s(-(1-k^2)) = 0 \quad (10)$$

The value of s(α) changes at most from $s^E$ to $s^E (1-k^2)$ when α remains in the range 0<α<ϵ. However, the value of s(α) can be changed from 0 to infinity when the range of α is extended to the entire real number axis, i.e., when α ranges from negative infinity to positive infinity. Moreover, s(α) remains negative on the interval $-1<\alpha<-(1-k^2)$. In this way, the elastic modulus of the piezoelectric substance 20 can be changed over a wide range by varying the shunt impedance between the electrodes.

Next, with reference to FIGS. 4 (*a*)–4 (*c*), we describe an example of the structure of an additional circuit, or control means, which has an inductance function and a negative capacitance function used in the experiment example to be explained below. The additional circuit illustrated in FIG. 4 (*a*) has an inductance function (L) between the two terminals. In practice, the terminals are connected to the electrodes 22. A single coil can be employed as the additional circuit. However, the coil will be used so as to make an active circuit having an operational amplifier achieve an inductance function capable of producing a large value of inductance, for example, 1 MH.

Figure 4A:
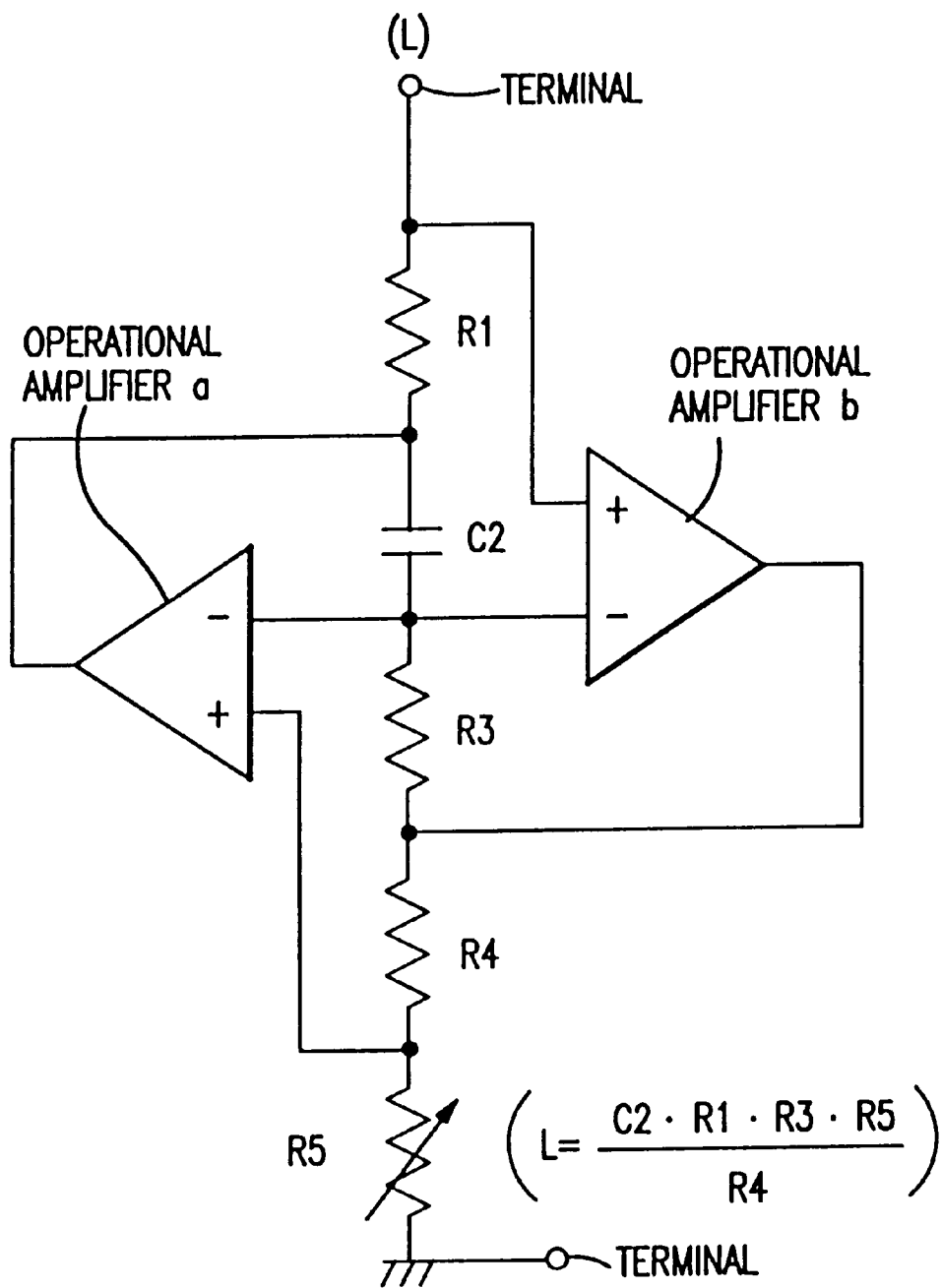
FIGS. 4 (a)–4 (c) illustrate the structure of the additional circuits.
Figure 4B:
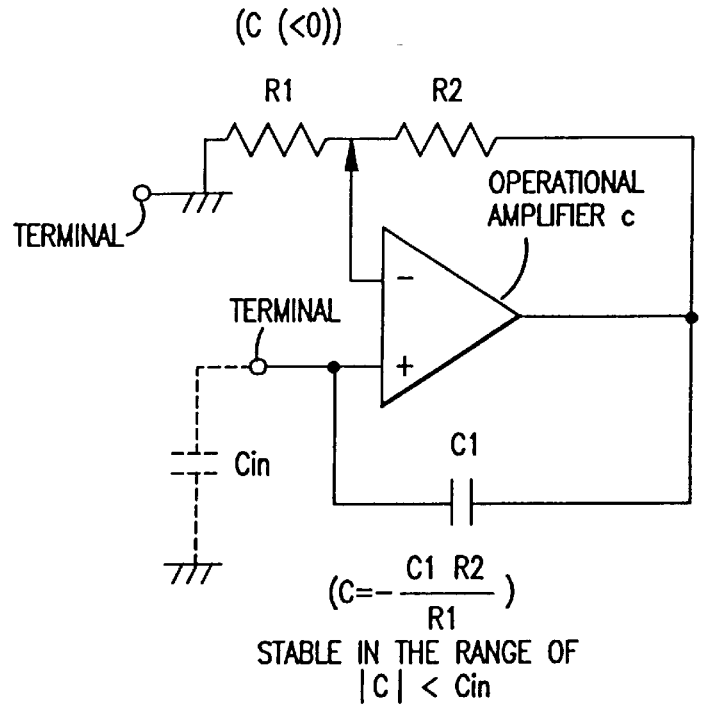
Figure 4C:
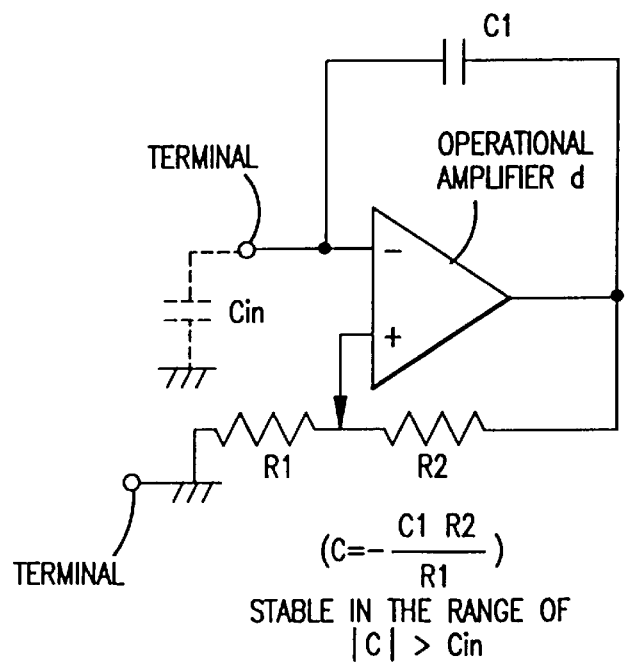

The circuit illustrated in FIG. 4 (*a*) has a resistor R1, a condenser C2, and resistors R2, R3, R4, and R5, which are serially connected in this order. Furthermore, the circuit has an operational amplifier. The non-reversible terminal and the reversible terminal of the operational amplifier a connected to the two power sources (not shown in the drawing) are connected to the connection point between the resistor R4 and the resistor R5, and the connection point between the condenser C2 and the resistor R3, respectively. The circuit also has its output terminal connected to the connection point between the resistor R1 and the condenser C2. Moreover, the circuit has an operation i.e., the value of resistor R5 amplifier b. The non-reversible terminal and the reversible terminal of the operational amplifier b connected to the two power sources (not shown in the drawing) are connected to the terminal side end of the resistor R1, and the connection point between the condenser C2 and the resistor R3, respectively. The circuit also has another output terminal of the operational amplifier b connected to the connection point between the resistor R3 and the resistor R4. In this case, the inductance L of this circuit is given by L=C2·R1·R3·R5/R4. In addition, by using a variable resistor for the resistor R5, the characteristics of the circuit element can be changed. In this way, the elastic modulus of the piezoelectric substance 20 can be controlled with ease by changing the value of the inductance L i.e., the value of resistor R5.

Each of the circuits illustrated in FIG. 4 (b) and (c) has a negative capacitance. On the one hand, if the capacitance of a sample is given by Cin, and the magnitude of the capacitance C of the circuit is less than Cin(|C|<Cin), the additional circuit shown in FIG. 4 (b) is used. On the other hand, if the magnitude of the capacitance C of the circuit is greater than Cin (|C|>Cin), the additional circuit shown in FIG. 4 (c) is used. The circuit shown in FIG. 4 (b) has a variable resistor comprising resistors R1 and R2, and an operational amplifier c (the power source for the operational amplifier c is not shown in the drawing) to which a condenser C1 is connected so as to form a positive feedback loop. The reversible terminal of the operational amplifier c is connected to the variable resistor. The circuit illustrated in FIG. 4 (c) has a variable resistor consisting of resistors R1 and R2, and an operational amplifier d (the power source for the operational amplifier d is not shown in the drawing) to which a condenser C1 is connected so as to form a negative feedback loop. The reversible terminal of the operational amplifier d is connected to the variable resistor. The capacitance C of any of the circuits pertaining to FIG. 4 (b) and FIG. 4 (c) can be given by C=−C2·R2/R1. The elastic modulus of the piezoelectric substance 20 can be controlled with ease by controlling the variable resistor, i.e., by changing the value of the capacitance C so as to change the characteristics of the circuit element. One of the circuits shown in FIGS. 4 (a)–4 (c) can be used as the additional circuit 24.

As explained in the above, according to the first embodiment of the present invention, the effective elastic modulus (the real part of the complex valued elastic modulus) and the energy loss modulus (the imaginary part of the complex valued elastic modulus) can be controlled by installing or disposing electrodes on the surface of the piezoelectric substance, and connecting a mechanism consisting of one or more circuit elements to each of the two electrodes. This will be explained later with reference to an experiment example in which an inductance circuit is connected to the electrodes. In particular, it should be noted that the elastic modulus of the piezoelectric substance can be controlled with ease by varying the characteristics of the one or more circuit elements. Thus, these circuit elements function as a control means for controlling the elastic modulus of the piezoelectric substance.

Next, the second embodiment of the present invention will be explained with reference to FIGS. 5 (a)–5 (b). The arrows in the drawings represent the directions in which the elastic modulus is measured. The present embodiment can be characterized in that the elastic modulus of a piezoelectric substance is controlled by feeding back the signals supplied from a sensor.

Figure 5A:
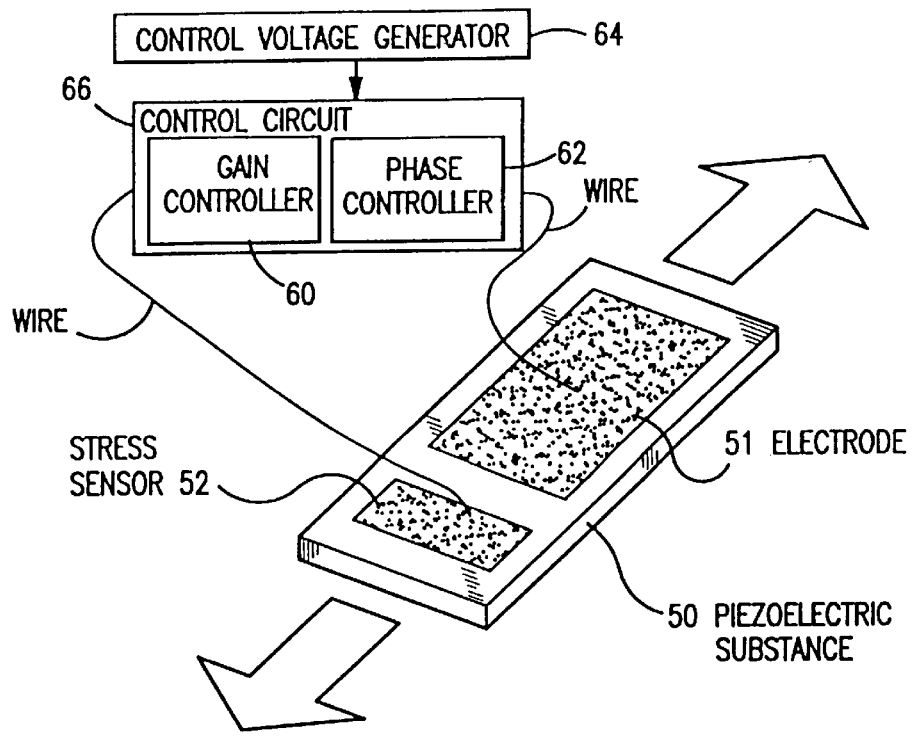
FIGS. 5 (a)–5 (b) illustrate a second embodiment of the present invention.
Figure 5B:
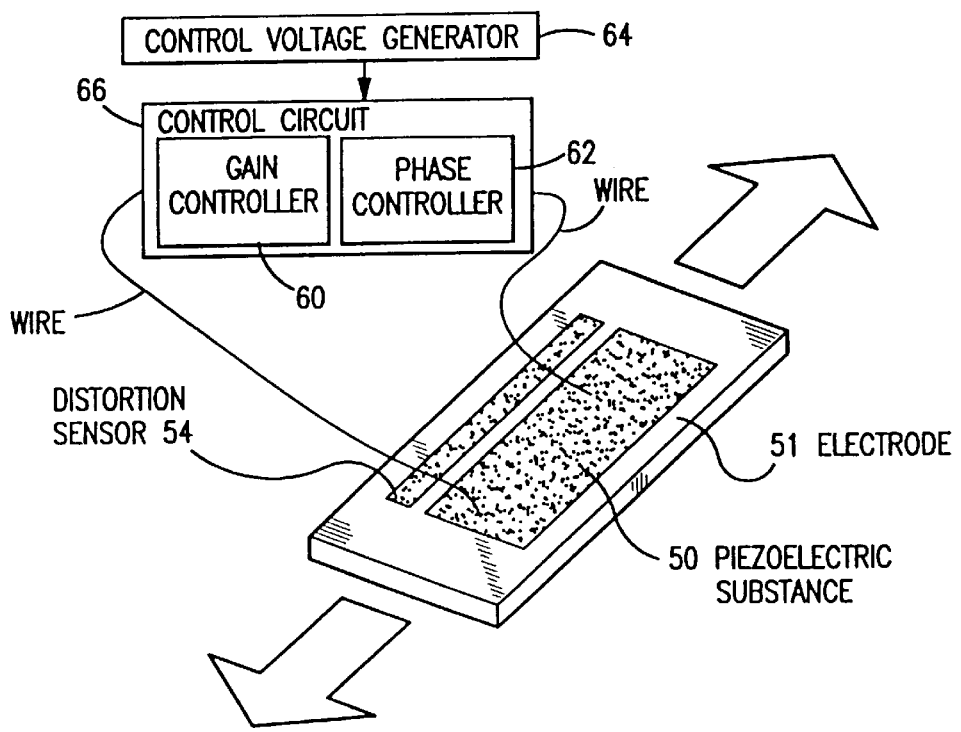

The device illustrated in FIG. 5 (a) has a piezoelectric substance 50, electrodes 51 installed or disposed on the surface of the piezoelectric substance 50, a stress sensor 52 formed on the piezoelectric substance 50, a control circuit 66 connected to the electrodes 51 and the stress sensor 52 with wires, and a control voltage generator 64 which supplies a voltage to the control circuit 66. The stress sensor 52 has a function which transforms a stress applied to the piezoelectric substance 50 into an electric signal. This sensor will not be specified since such sensors are in detail, known in the art. The stress sensor 52 simply transforms a stress into an electric signal. Therefore, in order to manufacture the stress sensor 52, for example, it suffices to dispose electrodes on a portion of the surface of the piezoelectric substance 20 so that a prescribed voltage will be produced corresponding to a prescribed stress.

A gain controller 60 and a phase controller 62 control the gain and the phase of the electric signal supplied from the stress sensor 52, respectively. The gain controller 60 can be achieved, for example, by using an EGCC (Electrical Gain Control Circuit) which controls the amplification factor of the electric signal with a control voltage supplied from a control voltage generator 64. The phase controller 62, for example, comprises elements the circuit constants of which are controlled with a control voltage supplied from the control voltage generator 64. The phase controller 62 can be realized by using a phase circuit which is capable of changing phase. The control voltage generator 64 functions as an interface which transforms an external control input into a voltage which controls the gain control part 60 and the phase controller 62. The control voltage generator 64 can be achieved, for example, by installing a voltage source whose control voltage can be made variable by an adjustment operation, or by installing a variable resistor in a regulator circuit and making the control voltage variable by controlling the value of the variable resistor. The EGCC, regulator circuit, and transfer circuit are officially known arts. Hence, these circuits will not be specified.

The device shown in FIG. 5 (b) has a piezoelectric substance 50, electrodes 51 installed on the piezoelectricity generating surface of the piezoelectric substance 50, a distortion sensor 54 formed on the piezoelectric substance 50, a control circuit 66 connected to the electrodes 51 and the distortion sensor 54 with wires, and a control voltage generator 64. The distortion sensor 54 transforms a distortion of the piezoelectric substance 50 into an electric signal. However, the distortion sensor 54 will not be specified in detail since such sensors are known in the art. Since the distortion sensor 54 simply needs to transform a distortion into an electric signal, the distortion sensor 54 can be manufactured, for example, by installing electrodes to be connected to the distortion sensor on a portion of the surface of the piezoelectric substance 50, and by designing the device so that a prescribed voltage will be generated corresponding to the generated distortion.

The gain controller 60 and the phase controller 62 control the gain and the phase of the electric signal supplied from the distortion sensor 54, respectively. The gain controller 60 can be achieved, for example, by employing an EGCC which controls the amplification factor with the control voltage supplied from the control voltage generator 64. The phase controller 62 comprises, for example, circuit elements whose circuit constants change corresponding to the control voltage supplied from the control voltage generator 64. The phase controller 62 can be achieved by employing a phase circuit capable of changing phase. The control voltage generator 64 functions as an interface which transforms the external control input into a voltage which controls the gain controller 60 and the phase controller 62. The control voltage generator 64 can be achieved by employing a voltage source which can be made variable with an adjustment operation or by controlling the value of a variable resistor installed in the regulator circuit. As in the case of the device shown in FIG. 5 (a), the EGCC, regulator circuit, and phase circuit are selected from those known in the art. Hence, these circuits will not be specified in detail.

In FIGS. 5 (a)–5 (b), the gain and the phase of the electric signal emitted from the sensors are controlled by the phase controller 62 which controls the control voltage supplied from the control voltage generator 64. In this embodiment also, a conductive material such as gold and aluminum can be used for the electrodes 51, and a piezoelectric material like the afore-mentioned materials can be used for the piezoelectric substance 50.

As described in the above, according to the embodiment shown in FIGS. 5 (a)–5 (b), the electric signal emitted from the stress sensor 52 or the distortion sensor 54 is fed back to the electrodes 51 installed or disposed on the sample piezoelectric substance 50. As will be shown later in an experiment example, the elastic modulus of the piezoelectric substance 50 can be changed over a wide range by the feedback function of this sensor output. In this case, a state of negative elasticity can be achieved independently of the frequency of the feedback electric signal. Moreover, a state with extremely large or small energy loss modulus can be obtained by changing the phase of the feedback signal. The variation characteristics of the elastic modulus of the piezoelectric substance 50 measured in this case becomes a measure for a limit value of the changes of the elastic modulus of the sample used in the first embodiment.

In this way, according to the second embodiment, the effective elastic modulus and the energy loss modulus of the piezoelectric substance 50 can be changed further more greatly by (1) installing electrodes on the piezoelectric substance 50, (2) installing a distortion sensor 54 which transforms a distortion of the piezoelectric substance 50 into an electric signal, or a stress sensor 52 which transforms a stress applied to the piezoelectric substance 50 into an electric signal, and (3) impressing the electric signal emitted from the distortion sensor 54 or the stress sensor 52. In addition, the effective elastic modulus and the energy loss modulus of the piezoelectric substance 50 can be changed by controlling the phase and/or the amplitude of the electric signal emitted from the sensor impressed to the electrodes 51.

EXPERIMENTAL EXAMPLES

Experimental example corresponding to first and second embodiments of the present invention will be explained in the discussion which follows.

The sample used in the experiments is a rectangular copolymer membrane with thickness 30 μm and dimensions 23×9 mm obtained by drawing VDF/TrFE (78/22) made of 78% VDF (vinylidene fluoride) and 22% TrFE (trifluoro ethylene) four times in the longitudinal direction. Electrodes with approximate dimensions 15×7 mm and thickness 0.2 μm are formed on the piezoelectricity generating surface of the sample by evaporating gold and by polarizing the evaporated gold by applying an electric field of strength 150 MV/m. The electrical-mechanical coupling coefficient k of the sample in the longitudinal direction is approximately 0.1.

First, the experiment result corresponding to the first embodiment will be mentioned. The inductance circuit shown in FIG. 4 (a) is employed as the additional circuit connected to the electrodes installed on the sample. In other words, the inductance circuit is used as an addition circuit, and the elastic piezoelectric resonance dispersion of the sample is measured when this addition circuit is attached to the sample.

As explained in the above, the prescribed inductance value is 1 MH, the circuit constants pertaining to FIG. 4 (a) are C2=20 μF, R1=100 kΩ, R3=100 kΩ, R5=100 kΩ as a variable resistor, and R4=20 kΩ. The inductance is prescribed to be approximately 1 MH so as to resonate the inductance circuit with the capacity Cs of the sample itself at the mechanical frequency 10 Hz for the purpose of measuring the elastic modulus of the sample.

Figure 9:
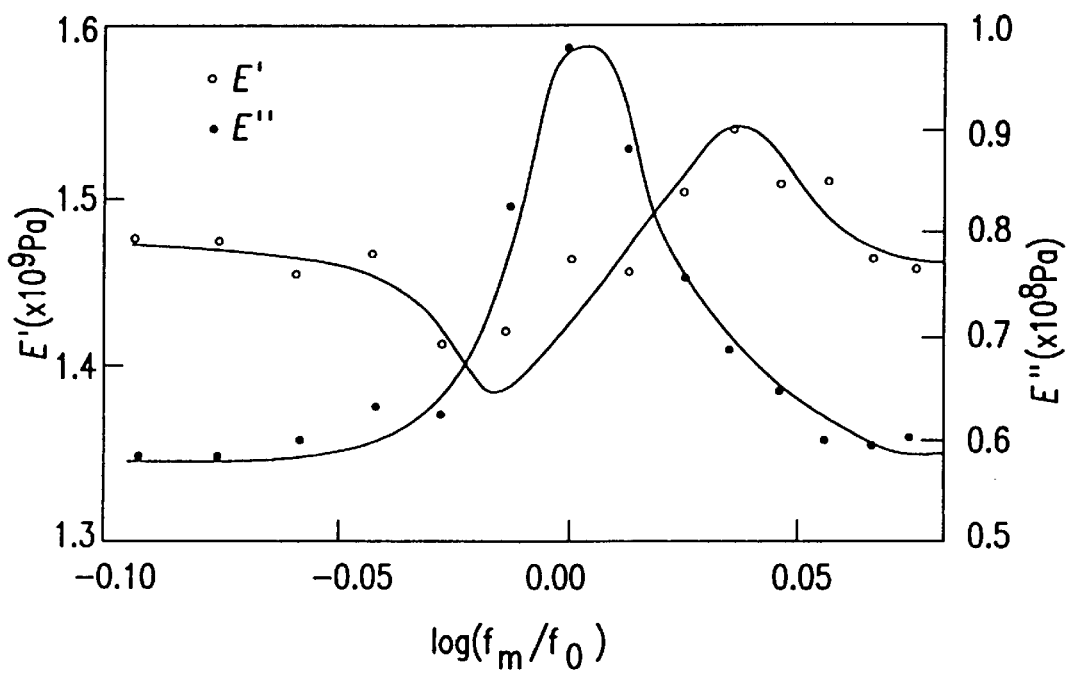
FIG. 9 illustrates a result of an experiment of the present invention.

The horizontal axis illustrated in FIG. 9 represents the logarithm of the ratio between the mechanical measurement frequency fm (measurement vibration frequency) supplied to the piezoelectric substance and the electric resonance frequency fo of the piezoelectric substance. The left vertical axis represents the real part E' (unit:×$10^9$ Pa) of the elastic modulus, and the right vertical axis represents the imaginary part E" (unit: ×$10^9$ Pa) of the elastic modulus. The white dots represent the E', and the black dots represent the E" in FIG. 9. As FIG. 9 shows, the real part of the elastic modulus (white dots) decreases, increases, and decreases again as the frequency increases. On the other hand, the imaginary part (black dots) of the elastic modulus increases to achieve a peak and then decreases as the frequency increases. Hence, FIG. 9 shows that the elastic piezoelectric resonance dispersion is generated when the inductance circuit is added to the piezoelectric substance. The elastic piezoelectric resonance dispersion changes the effective elastic modulus by approximately 1.4~1.55×$10^9$ Pa, and the energy loss modulus by approximately 0.6~1.0×$10^9$ Pa. This shows that a large amount of change in the elastic modulus can be obtained. The amount of change thus obtained is large in comparison with the amount of change in the elastic modulus which can be achieved by shorting and opening the electrodes, which is approximately 1%, since the electrical-mechanical coupling coefficient k of the sample is approximately 0.1.

Another experiment has been conducted in which the circuit shown in FIG. 4 (b) having a negative capacity is added to the measuring device. As mentioned in the above, the negative capacity has been achieved in the experiment in which the circuit coefficient C1 is set to 1000 pF, and the value of the variable resistor consisting of R1 and R2 is set to 100 kΩ. As a result, it has been confirmed that the elastic modulus of the sample can be increased by up to approximately 100%.

Next, the experiment corresponding to the second embodiment will be explained. FIG. 5 (b) shows the results of an embodiment in which the output signal emitted from the distortion sensor 54 is fed back to the electrodes 51 installed on the piezoelectric substance 50. The distortion sensor 54 generates a voltage of magnitude approximately 500 V corresponding to the maximum distortion of magnitude 1 μm.

Figure 6A:
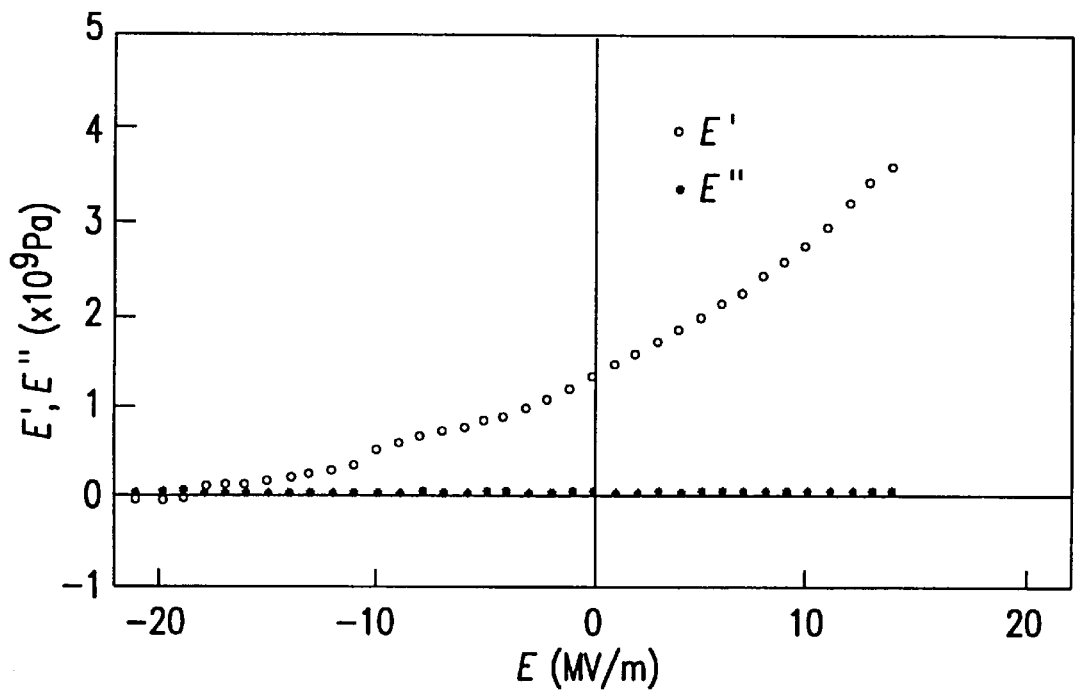
FIGS. 6 (a)–6 (b) illustrate a result of an experiment of the present invention.
Figure 6B:
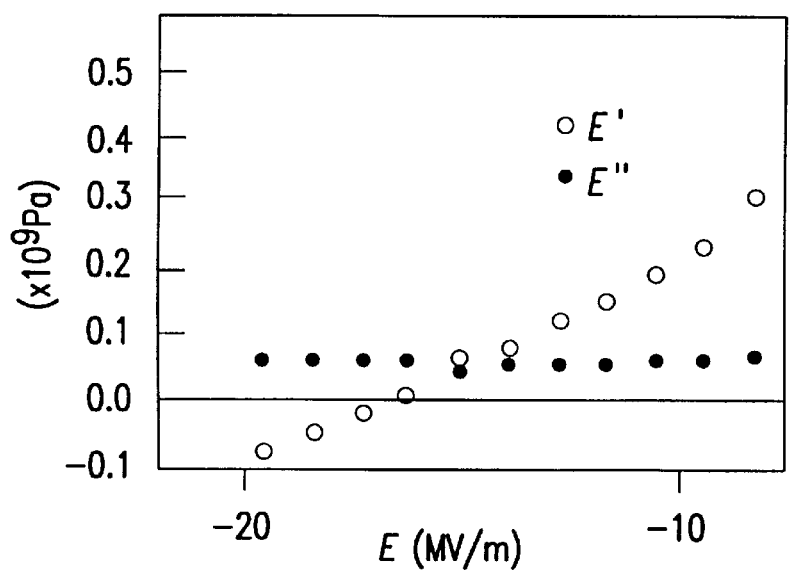
Figure 7:
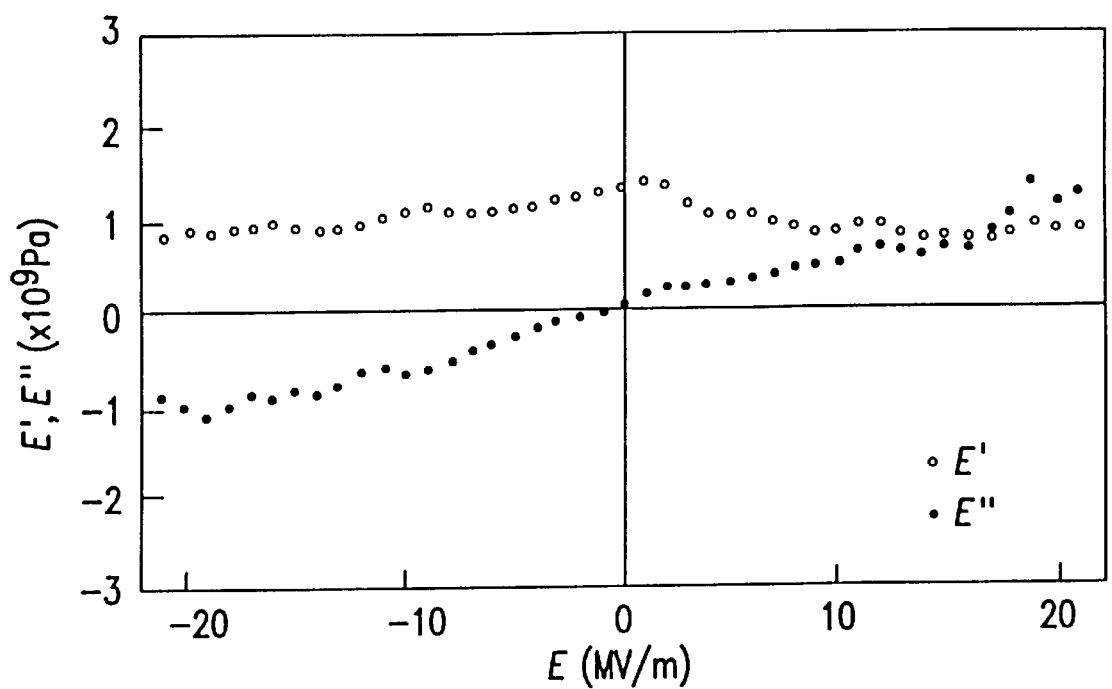
FIG. 7 illustrates a result of an experiment of the present invention.

In FIG. 6 (a) and FIG. 7, the horizontal axes represent the values of the electric field (unit: MV/m) corresponding to the output voltage supplied from the distortion sensor 54. The vertical axes represent the real part E' (unit: ×$10^9$ Pa) of the elastic modulus and the imaginary part E" (unit: ×$10^9$ Pa) of the elastic modulus. The white dots and the black dots represent E' and E", respectively. FIG. 6 (a) represents the case in which the amount of phase change of the sensor output is set to be 0°. FIG. 7 represents the case in which the amount of phase change of the sensor output is set to 90°. The amplitude of the sensor output is assumed to be amplified by a prescribed amplification factor.

FIG. 6(a) shows that (1) the energy loss modulus E" hardly changes when the feedback electric field E generated by the sensor changes, however, (2) the effective elastic modulus E' has an interval on which E" becomes negative and (3) the effective elastic modulus E' changes up to nearly 2.5 times in comparison with the case in which the feedback electric field is not impressed (E=0 (MV/m)). The lower left portion of FIG. 6(*a*) is represented in FIG. 6(*b*) as a magnification of a region in which E' and E" are in the range of approximately 0.1~0.3 ($\times 10^9$ Pa), which clearly shows that the effective elastic modulus E' can assume negative values.

Figure 8:
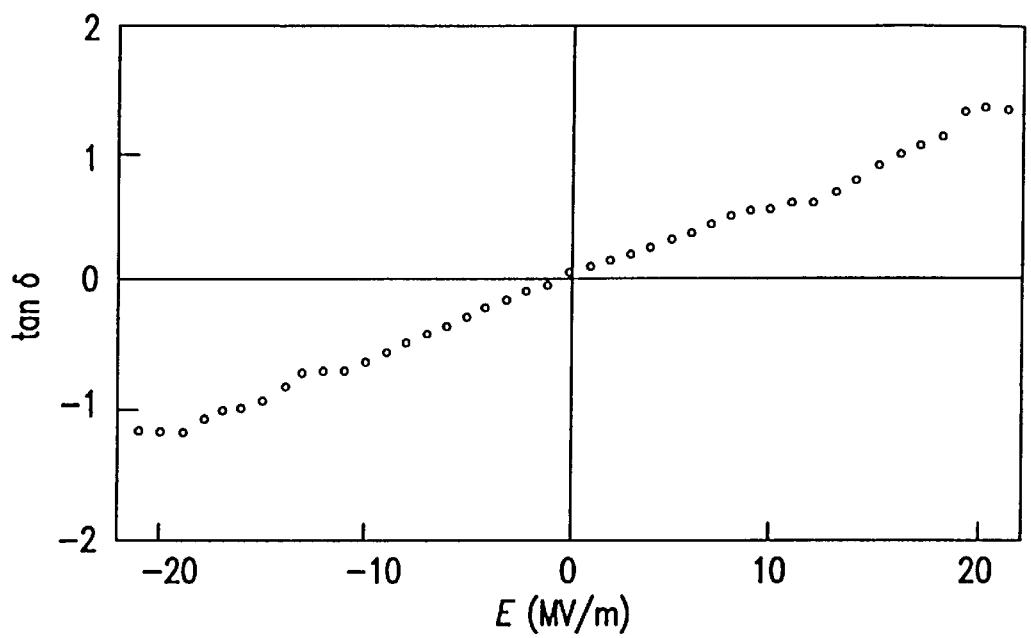
FIG. 8 illustrates a result of an experiment of the present invention.

FIG. 7 shows that the effective elastic modulus E' does not change very much when the feedback electric field E generated by the sensor changes. However, the energy loss modulus E" changes from negative values to positive values. FIG. 8 shows that the value of the loss tangent tan δ(=E"/ E') changes corresponding to the feedback electric field E generated by the sensor in the case the amount of phase change in the sensor output is set to 90°. As FIG. 8 shows, the loss tangent tan δ grows large as the feedback electric field E increases, and a so-called viscous state in which tan δ>1 is reached.

As explained in the above, a great amount of changes in the elastic modulus can be obtained with respect to the fact that the elastic modulus changes approximately by 1% by shorting and opening the electrodes since the electrical-mechanical coupling coefficient k of the sample is approximately 0.1.

The infinite elastic modulus (corresponding to "elastic modulus=∞" in FIG. 3) could not be measured since the elastic modulus was measured by using a constant distortion type viscoelastic measuring device (a device with which the elastic modulus (stress/distortion) is obtained from the stress when a constant distortion is applied to the sample). Furthermore, it has been confirmed that the equivalent inertia mass of a sample weighing 13 mg is 200 g when corresponding to the measurement frequency 100 Hz and the elastic modulus is negative (negative elasticity region).

As mentioned above, using the above-mentioned sample, the elastic modulus could be changed over a wide range. According to the present invention, the elastic modulus can be made negative or 2.5 times the elastic modulus achievable in the ordinary case (without feedback). Moreover, the loss tangent tan δ can be made negative and/or 1.5 times the loss modulus achievable in the ordinary case.

Various applications of the method and device of present invention should be mentioned.

(1) The present invention can be applied to a mechanical resonance system by noting the fact that the elastic modulus can be changed over a wide range so as to externally electrically control the resonance frequency of the mechanical resonance system.

(2) The present invention can be used as a damping element having a variable damping factor which can be controlled electrically.

(3) The present invention can be applied to an adaptive system which changes the mechanical characteristics of the system corresponding to changes in the environment. For example, the reflection and transmission characteristics of an elastic wave can be controlled by installing a device which is based on the present principle on the propagation path of the elastic wave, and by changing the mechanical impedance of this device. Hence, it is expected that the present invention can be applied to many fields.

As explained above, according to the first embodiment of the present invention, the effective elastic modulus (the real part of the elastic modulus) and the energy loss modulus (the imaginary part of the elastic modulus) can be changed over a wide range by installing or disposing electrodes on the surface of the piezoelectric substance and by connecting a control means or mechanism consisting of more than one circuit element to each of the electrodes.

According to the second embodiment of the invention, the effective elastic modulus (the real part of the elastic modulus) and the energy loss modulus (the imaginary part of the elastic modulus) can be changed over a further wide range by installing electrodes, and a control means or mechanism comprising a distortion sensor or a stress sensor on the surface of the piezoelectric substance and by impressing or feeding back the electric signal emitted from one of the sensors to the electrodes.

More particularly, according to the third embodiment of the invention, the effective elastic modulus (the real part of the elastic modulus) and the energy loss modulus (the imaginary part of the elastic modulus) can be changed with ease since the characteristics of at least one circuit element of the first embodiment are changed.

According to the fourth embodiment of the invention, the effective elastic modulus (the real part of the elastic modulus) and the energy loss modulus (the imaginary part of the elastic modulus) can be changed further effectively by changing at least one of the phase and the amplitude of the electric signal emitted from the sensor which is impressed to the electrodes.

While the present invention has been illustrated by means of certain preferred embodiments, one of ordinary skill in the art will recognize that additions, deletions, and improvements can be made while remaining within the spirit and scope of the invention as defined by the appended claims.

What is claimed is:

1. A piezoelectric device having a positively controllable effective elastic modulus, comprising:

a piezoelectric substance;

a pair of electrodes disposed on the piezoelectric substance; and circuit means connected to the electrodes for positively controlling the effective elastic modulus and the energy loss modulus of the piezoelectric substance.

2. A piezoelectric device having a positively controllable effective elastic modulus, comprising:

a piezoelectric substance;

a pair of electrodes disposed on the piezoelectric substance;

distortion sensor means for transforming a distortion of the piezoelectric substance into an electric signal; and control means for feeding the electrical signal to the electrodes to positively control the effective elastic modulus and the energy loss modulus of the piezoelectric substance.

3. A piezoelectric device having a positively controllable effective elastic modulus, comprising:

a piezoelectric substance;

a pair of electrodes disposed on the piezoelectric substance;

stress sensor means for transforming a stress to the piezoelectric substance into an electrical signal; and control means for feeding the electrical signal to the electrodes to positively control the effective elastic modulus and the energy loss modulus of the piezoelectric substance.

4. The device according to claim 1, wherein the control means comprises a resistive element.

5. The device according to claim 1, wherein the circuit means comprises a capacitance element.

6. The device according to claim 1, wherein the circuit means comprises a negative resistor element.

7. The device according to claim 1, wherein the circuit means comprises a negative capacitance element.

8. The device according to claim 2, further comprising phase shifting means for shifting the phase of the electric signal supplied to the electrodes.

9. The device according to claim 2, further comprising amplification means for amplifying the phase of the electric signal supplied to the electrodes.

10. The device according to claim 2, further comprising:

phase shifting means for shifting the phase of the electric signal supplied to the electrodes; and amplification means for amplifying the electric signal supplied to the electrodes.

11. The device according to claim 12, further comprising phase shifting means for shifting the phase of the electric signal supplied to the electrodes.

12. A method for positively controlling the effective elastic modulus of a piezoelectric substance having electrodes disposed thereon, comprising the steps of:

connecting a circuit element to the electrodes; and positively controlling the effective elastic modulus and the energy loss modulus of the piezoelectric substance with the circuit element.

13. The method for positively controlling the modulus of the piezoelectric substance according to claim 12, wherein the step of positively controlling further comprises:

changing the electrical characteristics of the circuit element.

14. A method for positively controlling the effective elastic modulus of a piezoelectric substance having electrodes disposed thereon and an associated distortion sensor, comprising the steps of:

generating an electrical signal at the distortion sensor indicative of a distortion of the piezoelectric substance; and positively controlling the effective elastic modulus and the energy loss modulus of the piezoelectric substance by supplying the electric signal of the distortion sensor to the electrodes.

15. The method according to claim 14, further comprising the step of:

changing at least one of the phase and the amplitude of the electric signal before supplying the electric signal to the electrodes.

16. A method for positively controlling the effective elastic modulus of a piezoelectric substance having electrodes disposed thereon and an associated stress sensor, comprising the steps of:

generating an electrical at the stress sensor indicative of a stress applied to the piezoelectric substance; and positively controlling the effective elastic modulus and the energy loss modulus of the piezoelectric substance by supplying the electric signal of the stress sensor to the electrodes.

17. The method according to claim 16, further comprising the step of:

changing at least one of the phase and the amplitude of the electric signal before supplying the electric signal to the electrodes.

18. The device according to claim 1, wherein the control means comprises means for emulating an inductor.

19. The device according to claim 18, wherein the emulating means comprises a plurality of operational amplifiers.

20. The device according to claim 2, wherein the control means comprises means for emulating a negative resistor element.

21. The device according to claim 20, wherein the emulating means comprises:

an operational amplifier having at least two input terminals and an output terminal; and a capacitor connected across one of the at least two input terminals and the output terminal of the operational amplifier.

* * * * *